April 18, 1961 R. CLAYDON 2,980,746

MANUFACTURE OF THERMOELECTRIC DEVICES

Filed Feb. 18, 1959

INVENTOR

Roy Claydon

BY Finkelstein, Finkelstein & Ottinger

ATTORNEYS 2,980,746

MANUFACTURE OF THERMOELECTRIC DEVICES

Roy Claydon, Finchley, London, England, assignor to The General Electric Company Limited, London, England Filed Feb. 18, 1959, Ser. No. 794,047

Claims priority, application Great Britain Feb. 20, 1958

5 Claims. (Cl. 136—4)

Figure 1:
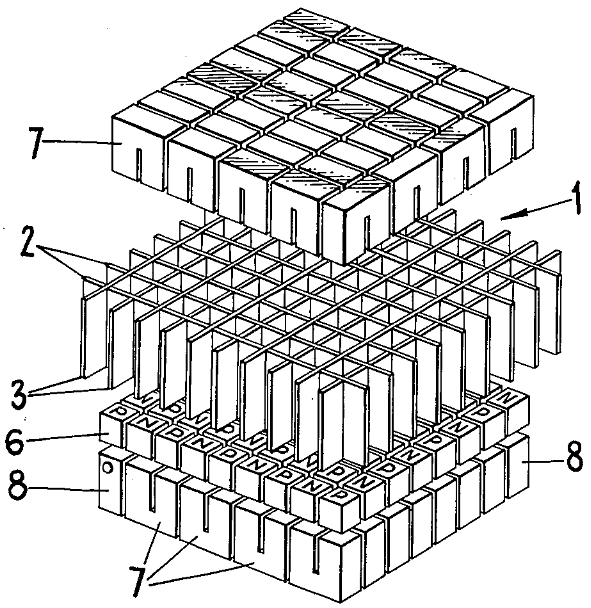

The present invention relates to the manufacture of thermoelectric devices of the kind comprising an assembly of thermoelectric elements which are electrically connected to provide hot junctions and cold junctions disposed respectively on opposite sides of the assembly.

Thermoelectric devices of this kind are particularly suitable for use as cooling units for thermoelectric refrigerators such as are described in patent specification No. 798,882. The cooling units described in the above-mentioned specification use, for the thermoelectric elements, a semiconductor material, the dissimilar elements of a thermocouple comprising a p-type semiconductor element and an n-type semiconductor element. Because of the smallness of the individual semiconductor elements used in such units it is not easy to make the appropriate electrical connections so as to provide a neat and compact assembly, and one object of the present invention is to provide an improved method of making the connections whereby the manufacture of such units is facilitated.

The thermoelectric elements need not however be of semiconductor material; they may be, for example, of bismuth and antimony. In such cases it would be appropriate to term the element of a thermocouple having an abundance of electrons the n-type element, and the other the p-type element, following the nomenclature prevalent in the semiconductor art.

According to one aspect of the present invention, in a method of manufacturing a thermoelectric device comprising a plurality of thermocouples connected electrically in series, the dissimilar elements of the thermocouples being disposed alternately in a rectangular array, and rigid metallic bridging members providing the electrical connections between adjacent elements, said members being disposed alternately on opposite sides of the array and providing the hot and cold junctions of the device respectively, the elements and said members are assembled in a jig of egg-box form, and while so assembled the members are bonded to the elements.

The bridging members may be bonded to the elements by soldering, the assembly being heated to form the soldered joints simultaneously. The jig is preferably composed of intersecting strips which are adapted to be withdrawn from the assembly between the rows of bridging members after the members have been bonded to the elements.

According to another aspect of the present invention, a thermoelectric device comprises a plurality of thermocouples connected electrically in series, the dissimilar elements of said thermocouples being disposed alternately in a rectangular array, and rigid metallic bridging members providing the electrical connections between adjacent elements, said members being disposed alternately on opposite sides of the array and providing the hot and cold junctions of the device respectively while holding the elements together as a rigid unit.

Figure 2:
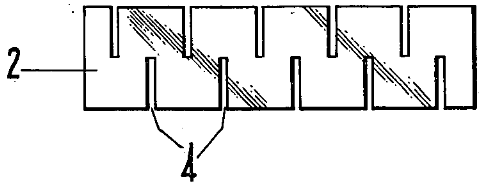
Figure 3:
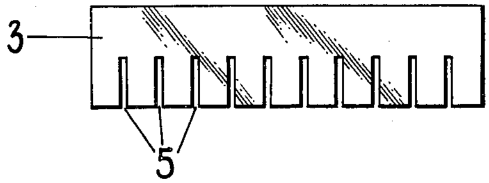

One method of manufacturing a thermoelectric device in accordance with the present invention will now be described by way of example with reference to the accompanying drawing, in which:

Figure 1 is an exploded view of the assembly, the figure showing the thermoelectric elements, the jig, and the connectors, and Figures 2 and 3 show respectively two types of strip of which the jig is composed.

Referring to the drawing, the jig 1, used in assembling the elements, is of egg-box form, that is to say it comprises a plurality of intersecting web members 2 and 3 providing a rectangular array of cells or pockets. One of the web members 2 is shown in Figure 2, and comprises a strip of insulating material having vertical slots 4 alternately adjacent to its upper and lower edges, and one of the web members 3 is shown in Figure 3, this member comprising a strip of insulating material having vertical slots 5 spaced along its lower edge. There are nine members 2 and ten members 3 in the jig, the slots in the members interengaging to form the egg box arrangement shown in Figure 1.

In manufacturing the device, the thermoelectric elements 6, which may be of semiconductor material such as bismuth telluride, are placed one in each of the cells of the jig so that they form a rectangular array in each row of which p-type and n-type elements are disposed alternately. In order to complete the assembly it is now necessary to make electrical connections to the elements. For this purpose bridging members in the form of U-shaped aluminium connectors 7 are provided, these connectors being arranged in rows as shown, and are inserted into the cells so that the two limbs of a connector engage with adjacent elements of opposite conductivity type. End terminal blocks 8 are also provided.

Prior to insertion of the connectors, the ends of the connectors are nickel-plated and tinned. When all of the elements and connectors are assembled as shown in Figure 1, a weight is applied to the upper surface and the assembly is heated so that each element becomes soldered between two opposing connectors and the elements of the assembly are thus connected electrically in series.

The jig is removed from the assembly after the connections have been made, each strip being withdrawn from the assembly between two rows of elements and connectors. Finally the assembly is potted in heat-insulating resin such as "Araldite" so as to fill the spaces between adjacent elements and connectors, and the two sides forming the hot and cold sides of the device are machined flat so that heat exchange members can be readily fitted to them.

In an alternative construction, the strips are left in position between the elements after the connections have been made.

I claim:

1. A method of manufacturing a thermoelectric device, said method comprising assembling a plurality of thermoelectric elements to form a rectangular array of alternately disposed dissimilar elements, the elements being assembled in a jig, said jig comprising a plurality of intersecting strips forming a rectangular array of cells open at their tops and bottoms, placing in contact with said elements so as to connect the elements in series a plurality of U-shaped rigid metallic bridging members whose ends are fitted into adjacent cells to bridge adjacent elements with the intermediate portions thereof bridging the strips supporting said adjacent cells, disposing said members alternately on opposite sides of the array, coating contacting surfaces of the elements and the members with soldering material, and then heating the assembly to solder the members to the elements.

2. A thermoelectric device comprising a plurality of thermocouples connected electrically in series, the dissimilar elements of said thermocouples being disposed alternately in a rectangular array, and U-shaped rigid metallic bridging members providing the electrical connections between adjacent elements, said members being disposed alternately on opposite sides of the array and providing the hot and cold junctions of the device respectively while holding the elements together as a rigid unit.

3. A thermoelectric device as claimed in claim 2, wherein the said bridging members are of aluminium.

4. A thermoelectric device as claimed in claim 2 wherein the elements are separated by intersecting strips of insulating material.

5. A thermoelectrical device as claimed in claim 2, wherein the spaces between adjacent elements and adjacent bridging members are filled with heat insulating material.

References Cited in the file of this patent

UNITED STATES PATENTS

| | | |
|---|---|---|
| 1,120,781 | Altenkirch et al. | Dec. 14, 1914 |
| 1,848,655 | Petrik | Mar. 8, 1932 |
| 2,289,152 | Telkes | July 7, 1942 |
| 2,749,716 | Lindenblad | June 12, 1956 |
| 2,837,899 | Lindenblad | June 10, 1958 |
| 2,844,638 | Lindenblad | July 22, 1958 |